United States Patent
Chu

(10) Patent No.: US 8,431,837 B2
(45) Date of Patent: Apr. 30, 2013

(54) WATERPROOF JACKET ASSEMBLY AND COMMUNICATION DEVICE EMPLOYING THE SAME

(75) Inventor: Chung-Jun Chu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 276 days.

(21) Appl. No.: 12/954,911

(22) Filed: Nov. 29, 2010

(65) Prior Publication Data

US 2011/0226526 A1  Sep. 22, 2011

(30) Foreign Application Priority Data

Mar. 17, 2010  (CN) .......................... 2010 1 0125692

(51) Int. Cl.
*H02G 3/18* (2006.01)

(52) U.S. Cl.
USPC ........... 174/659; 174/563; 174/665; 174/135; 439/63; 439/271

(58) Field of Classification Search ................. 174/659, 174/563, 665, 135; 439/63, 271
See application file for complete search history.

(56) References Cited

U.S. PATENT DOCUMENTS

| 4,021,604 A * | 5/1977 | Dola et al. ....................... 174/51 |
| 5,221,813 A * | 6/1993 | Michael et al. ............... 174/659 |
| 7,459,643 B2 * | 12/2008 | de la Borbolla .............. 174/655 |
| 8,097,819 B2 * | 1/2012 | Su ................................. 174/665 |
| 8,164,008 B2 * | 4/2012 | Maruyama et al. ........... 174/657 |

FOREIGN PATENT DOCUMENTS

| CN | 101352113 A | 1/2009 |
| TW | 562397 | 11/2003 |

* cited by examiner

*Primary Examiner* — Dhirubhai R Patel
(74) *Attorney, Agent, or Firm* — Altis Law Group, Inc.

(57) ABSTRACT

A waterproof jacket assembly applied in a communication device is disclosed. The communication device includes an enclosure defining a first through hole for a transmission wire passing through. The waterproof jacket assembly is mounted on the enclosure corresponding to the first through hole, and includes a sleeve, an elastic waterproof element and a cover board. The sleeve defines a receiving cavity in communication with the first through hole. The elastic waterproof element is received in the receiving cavity and helically wrapped around the transmission wire. The transmission wire passes through the cover board and the cover board engages with the sleeve to drive the elastic waterproof element to fill in the receiving cavity.

20 Claims, 7 Drawing Sheets

WATERPROOF JACKET ASSEMBLY AND COMMUNICATION DEVICE EMPLOYING
THE SAME

BACKGROUND

1. Technical Field

The present disclosure relates to a communication device, and more particularly to a waterproof jacket assembly applied in the communication device.

2. Description of Related Art

Generally, an outdoor communication device must meet a certain waterproof grade to prevent electrical elements in an enclosure of the communication device from being damaged by water or moisture. However, the enclosure of the communication device must comprise one or more holes to pass transmission wires through to communicate the communication device with other communication devices.

One waterproofing method for the holes in the enclosure is to use gasket rings engaged between the transmission wires and the holes. With the method, a special tool is required to mount the gasket ring between the transmission wires and the holes by a uniform pressure, and a tolerance between the transmission wires and the holes is required to be accurately controlled to avoid failures. Therefore, it is difficult to assemble the communication device using the gasket ring for waterproofing.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
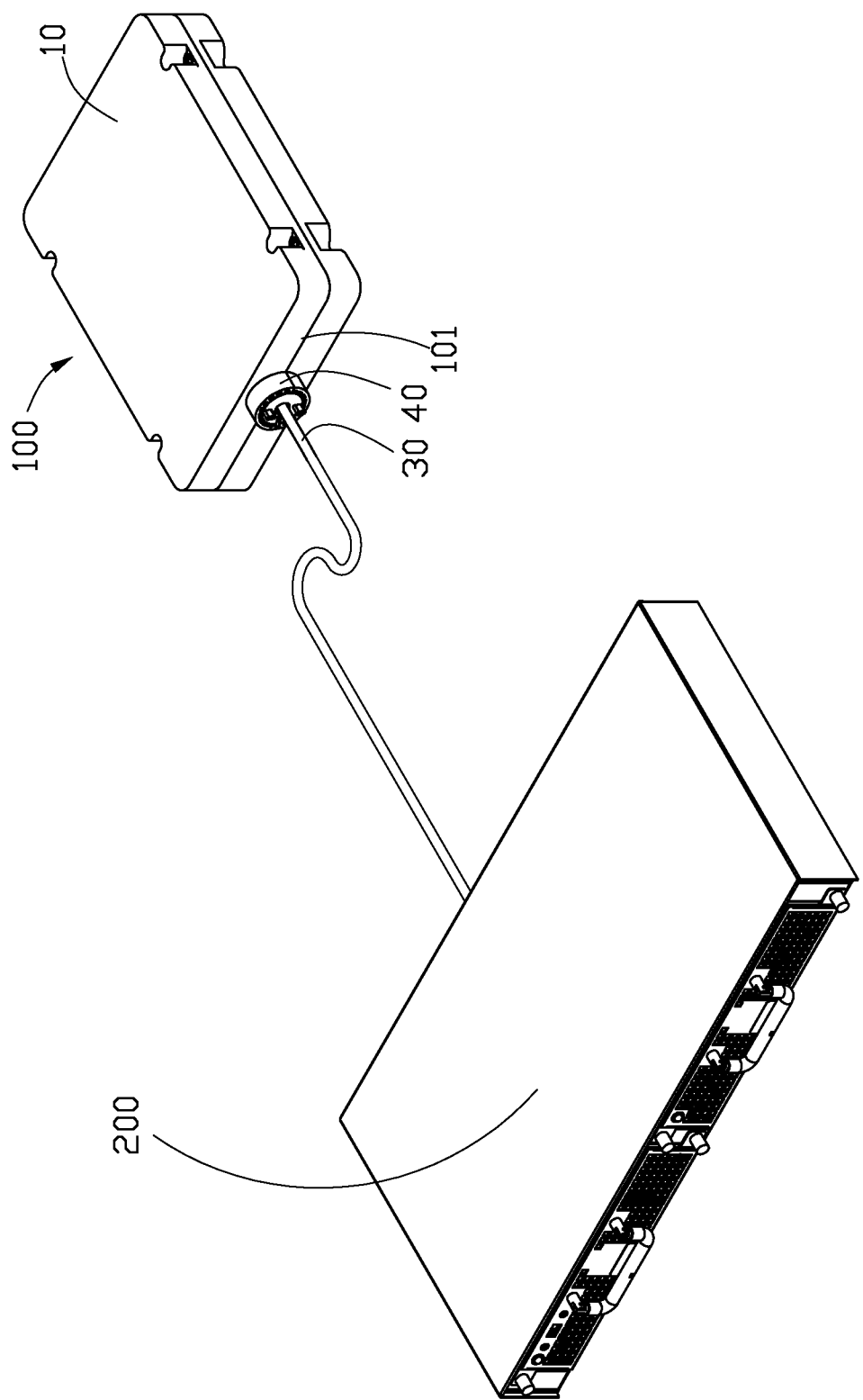
FIG. 1 is a schematic drawing of a communication device connecting with other communication device in accordance with the present disclosure.
Figure 2:
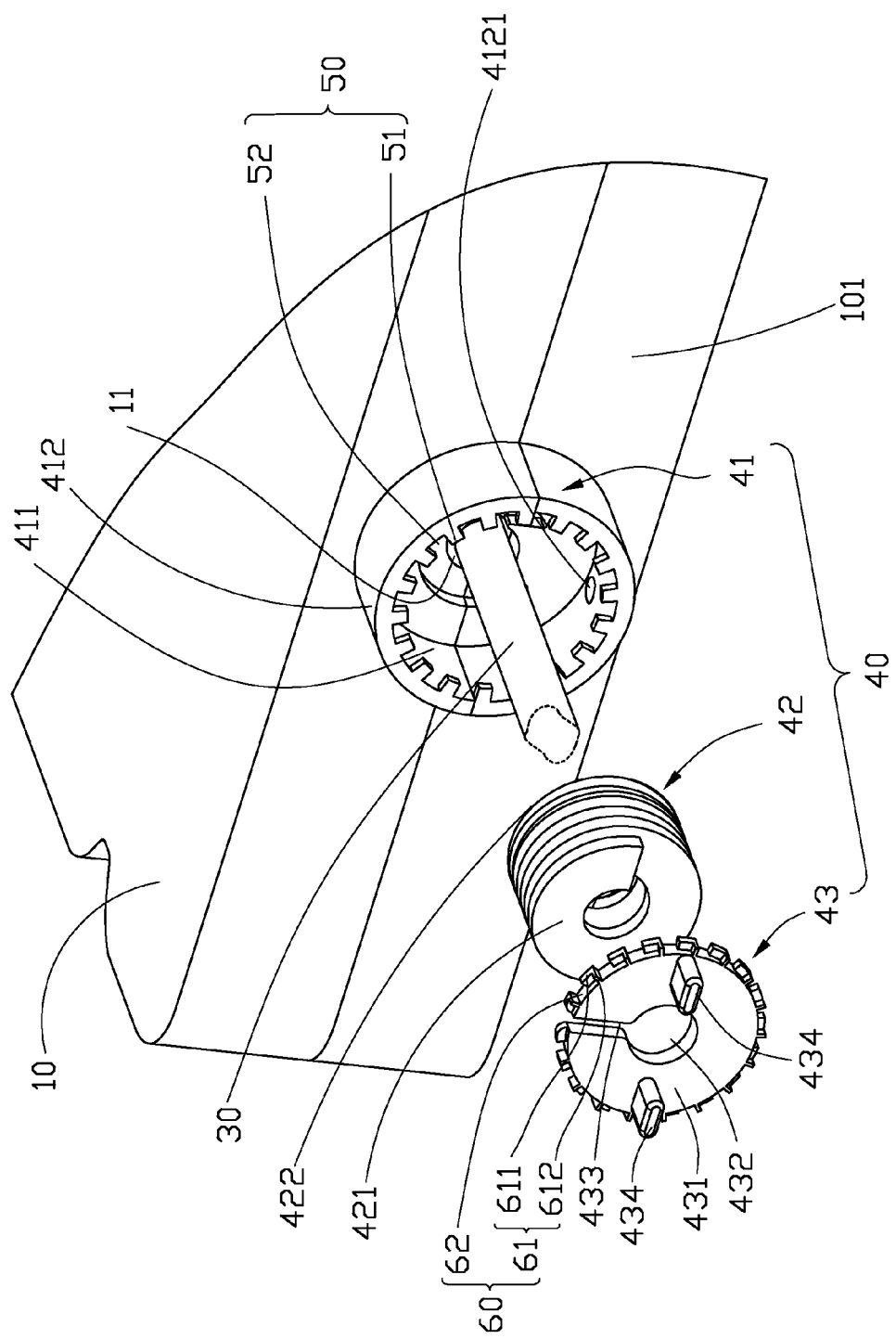
FIG. 2 is a disassembled perspective view of a waterproof jacket assembly of the communication device of FIG. 1.
Figure 3:
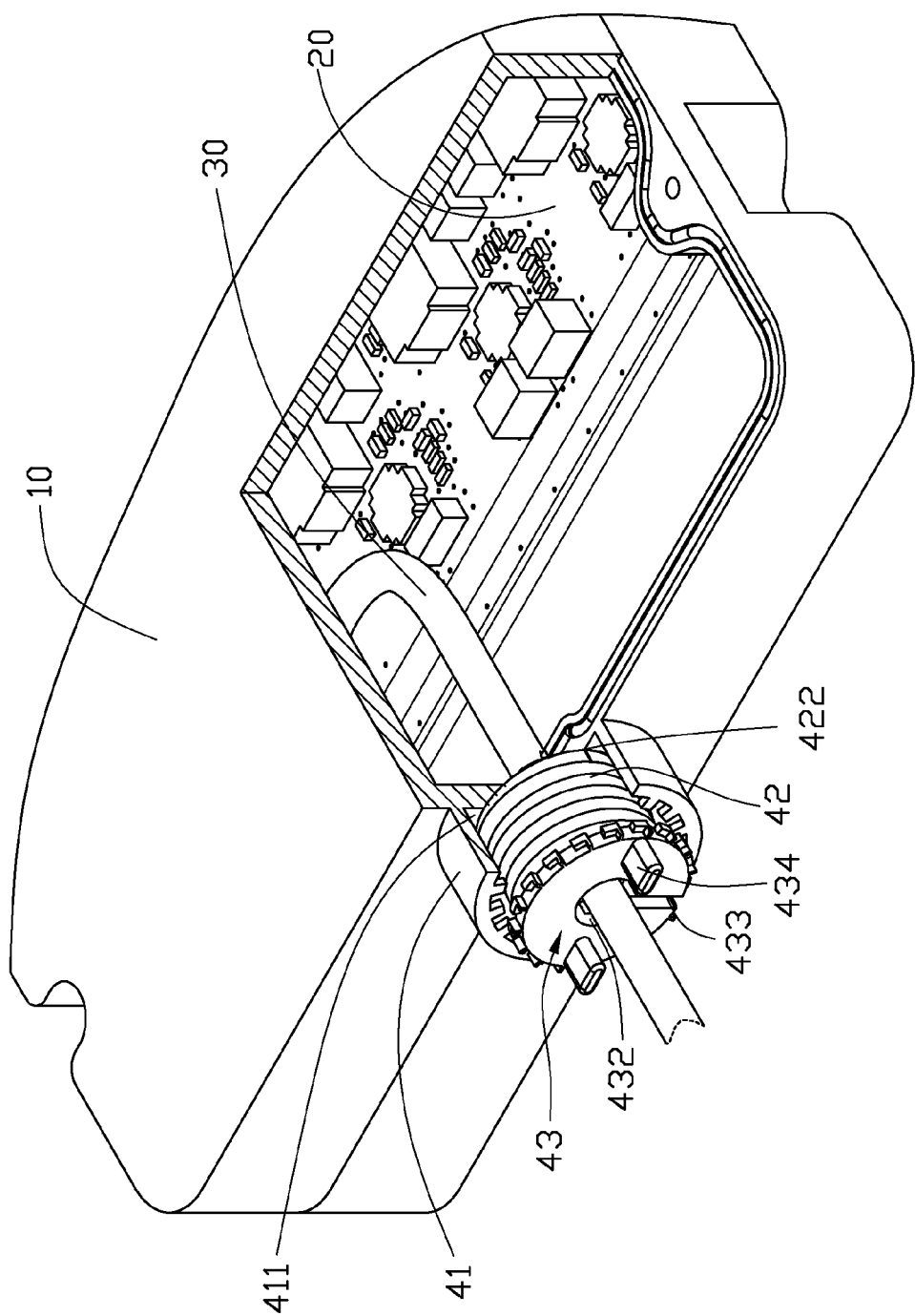
FIG. 3 is a cross-sectional view, showing the waterproof jacket assembly mounted on the communication device when a cover board of the waterproof jacket assembly is unscrewed.

Referring to FIG. 1, FIG. 2 and FIG. 3, a communication device 100 that can be exposed outdoors, comprises an enclosure 10, a circuit arrangement 20 received in the enclosure 10, at least one transmission wire 30 and a waterproof jacket assembly 40 disposed on the enclosure 10. The enclosure 10 defines a first through hole 11 extending from an outer surface 101 to an inner of the enclosure 10. The transmission wire 30 passes through the first through hole 11 to connect the circuit arrangement 20 in the enclosure 10 with another communication device or power supply equipment 200 for communicating or supplying power. The waterproof jacket assembly 40 is mounted on the outer surface 101 corresponding to the first through hole 11 to prevent water, dust and moisture from entering into the inner of the enclosure 10 along the first through hole 11 and the transmission wire 30, and to ensure the communication device 100 works normally outdoors.

The waterproof jacket assembly 40 comprises a sleeve 41, an elastic waterproof element 42 and a cover board 43. The sleeve 41 is on the outer surface 101 of the enclosure 10 and defines a receiving cavity 411 in communication with the first through hole 11. In the illustrated embodiment, the first through hole 11 and the sleeve 41 are on a common central line.

In the illustrated embodiment, the sleeve 41 is integrally formed with the enclosure 10. In other embodiment, the sleeve 41 can be mounted on the enclosure 10 by a screw or bolt with nut, for example, and then sealed with waterproof materials.

The sleeve 41 comprises a first positioning portion 50 used to position the cover board 43 and the sleeve 41 in the receiving cavity 411. In the illustrated embodiment, the first positioning portion 50 comprises a plurality of blocks 51 protruding radially from one edge of the sleeve 41 toward the receiving cavity 411. The first positioning portion 50 defines a plurality of first grooves 52 between any two adjacent blocks 51 of the first positioning portion 50.

The elastic waterproof element 42 comprises a first end 421 and a second end 422. The first end 421 is mounted on the cover board 43 and the second end 422 is a free end. The elastic waterproof element 42 is helically wrapped on the transmission wire 30. The elastic waterproof element 42 is received in the receiving cavity 411 of the sleeve 41 when the cover board 43 mounted on the sleeve 41. In the illustrated embodiment, the elastic waterproof element 42 is made of rubber and in a helical shape to be wrapped on the transmission wire 30.

The transmission wire 30 passes through the cover board 43 and the cover board 43 engages with the sleeve 41 to drive the elastic waterproof element 42 to fill in the receiving cavity 411. The cover board 43 comprises a main body 431 and a second positioning portion 60 extending radially from the main body 431 outwardly, and defines a second through hole 432 and a latching groove 433. The second through hole 432 is defined in the center of the main body 431 for the transmission wire 30 passing through. The latching groove 433 extends from edge of the main body 431 to the second through hole 432 and communicates with the second through hole 432. The transmission wire 30 passes through the second through hole 432 along the latching groove 433 in assembly. In the embodiment, the cover board 43 is made of plastic materials, so that the transmission wire 30 can be foisted into the second through hole 432 by way of the latching groove 433.

The second positioning portion 60 is disposed on edge of the cover board 43. The cover board 43 is mounted on the sleeve 41 via the second positioning portion 60 engaging with the first positioning portion 50 to shield the receiving cavity 411. In the illustrated embodiment, the second positioning portion 60 comprises a plurality of stopper portions 61 uniformly distributing on edge of the cover board 43, and defines a plurality of second grooves 62 between any two adjacent stopper portions 61. Each of the plurality of stopper portions 61 comprises a first abutting portion 611 and a second abutting portion 612 perpendicular to the first abutting portion 611. In the illustrated embodiment, the first abutting portion 611 and the second abutting portion 612 collectively form an "L" shape.

In the illustrated embodiment, the cover board 43 further comprises a pair of operating portions 434 protruding outwardly from the main body 431 of the cover board 43 for user rotating the cover board 43 conveniently.

Figure 4:
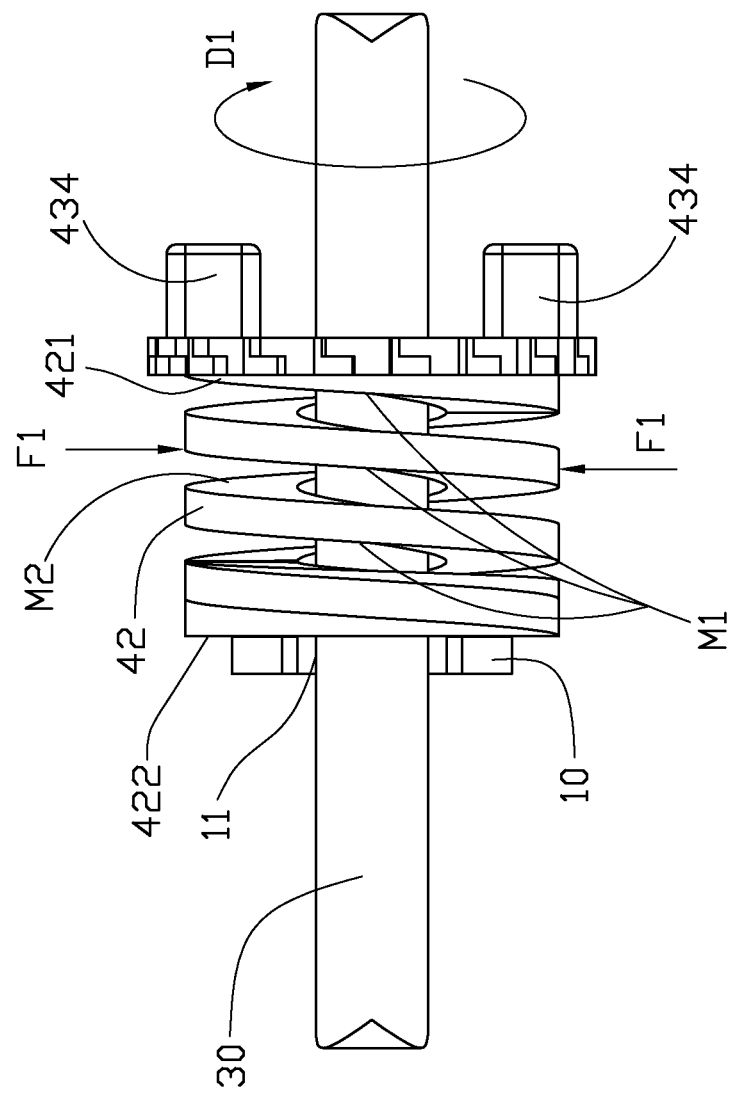
FIG. 4 is an isometric view showing the cover board unscrewed from an elastic waterproof element of FIG. 3.

Referring to FIG. 3 and FIG. 4, when mounting the cover board 43 and the elastic waterproof element 42 onto the sleeve 41, the elastic waterproof element 42 is wound around the transmission wire 30, and the transmission wire 30 is foisted into the second through hole 432 by way of the latching groove 433. The elastic waterproof element 42 is received in the receiving cavity 411 of the sleeve 41 and the second end 422 of the elastic waterproof element 42 resists on the enclosure 10. The second positioning portion 60 engages with the first positioning portion 50 to shield the receiving cavity 411. When rotating the operating portion 434 around a direction of D1, the cover board 43 engages with the sleeve 41 to drive the elastic waterproof element 42 to fill in the receiving cavity 411, so as to make the elastic waterproof element 42 wind the transmission wire 30 tightly along a radial direction of the elastic waterproof element 42 by rotation of the cover board 43. The elastic waterproof element 42 is compressed on the radial direction and generates a centripetal force F1 to tightly clamp the transmission wire 30 when winding up the elastic waterproof element 42 due to the helical shape of the elastic waterproof element 42. And a first sealing surface M1 is generated, that is, the first sealing surface M1 is the interface of inside surface of the elastic waterproof element 42 and the outer surface of the transmission 30, as showing in FIG. 4.

Figure 5:
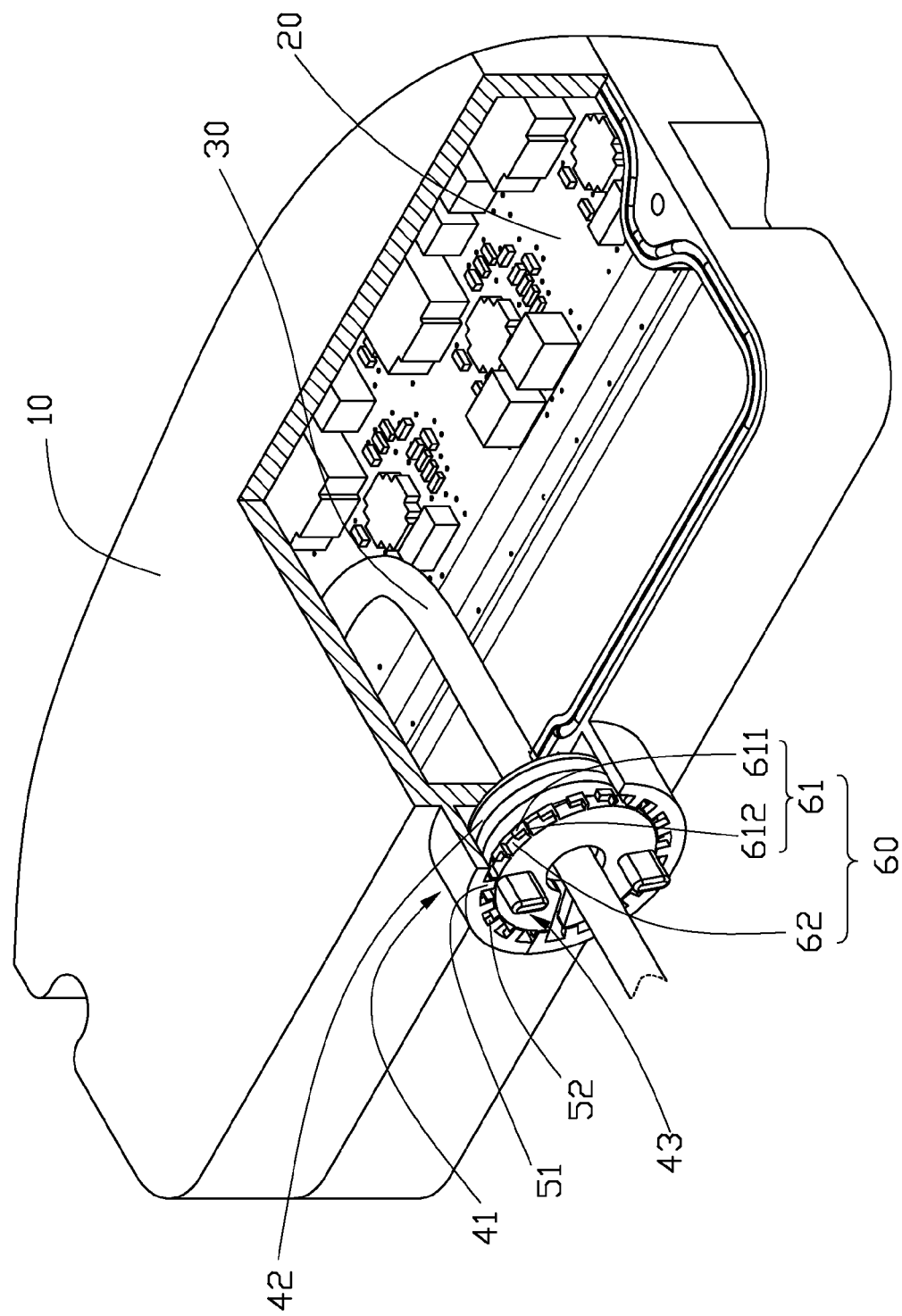
FIG. 5 is a cross-sectional view, showing the waterproof jacket assembly mounted on the communication device when the cover board of the waterproof jacket assembly is screwed.
Figure 6:
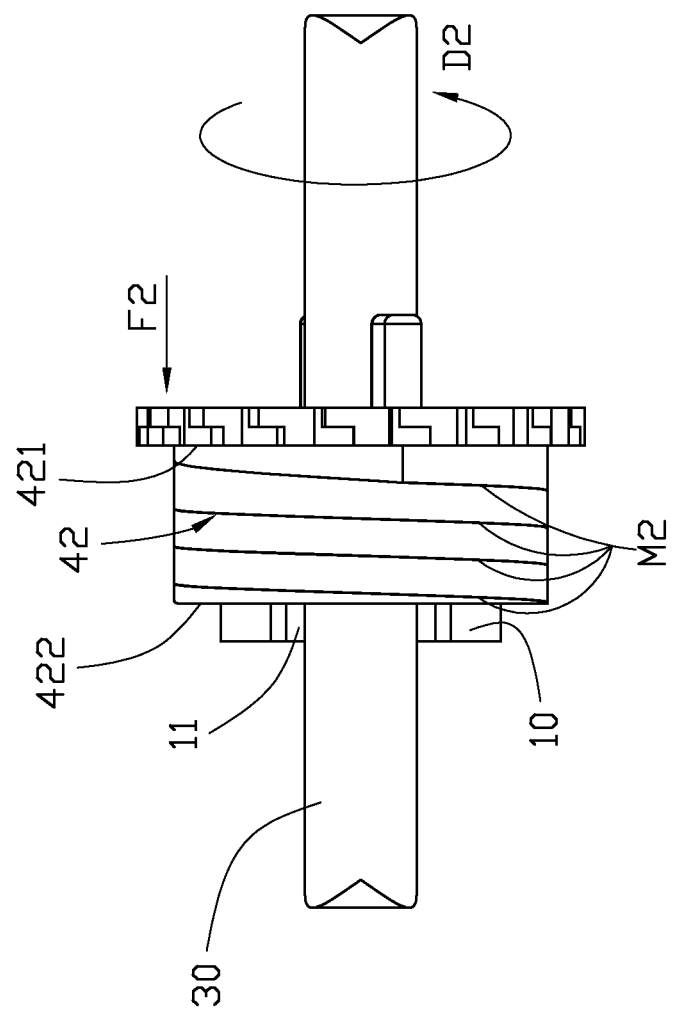
FIG. 6 is an isometric view showing the cover board screwed down on the elastic waterproof element of FIG. 5.

Please referring to FIG. 5 and FIG. 6, an axial force F2 is generated towards the enclosure 10 along an axial direction the elastic waterproof element 42 by winding up the elastic waterproof element 42. The axial force F2 is exerted on the cover board 43 to push the cover board 43 towards the enclosure 10 and to press the elastic waterproof element 42 along the axial direction. Each of the plurality of blocks 51 passes through the corresponding second groove 612 and interferingly engages with the corresponding stopper portions 61 by rotating the cover board 43 to mount the cover board 43 onto the sleeve 41. Under the function of the axial force F2, the elastic waterproof element 42 is pressed to generate a second sealing surface M2, as shown in FIG. 4 and FIG. 6. The second sealing surface M2 is the interface between any two adjacent surfaces of the elastic waterproof element 42 due to the helical shape of the elastic waterproof element 42. A restoring force of the elastic waterproof element 42 along the axial direction is generated when removing the axial force F2. Under the function of the restoring force, each of the plurality of the first abutting portion 611 resists on the corresponding block 51 and each of the plurality of the blocks 51 latches on the corresponding second abutting portion 612, as shown in FIG. 5. Therefore, the water jacket assembly 40 is sealed between the first through hole 11 of the enclosure 10 and the transmission 30 along both the axial direction and the radial direction of the elastic waterproof element 42.

In the illustrated embodiment, the sleeve 41 comprises a periphery wall 412. The periphery wall 412 defines a drainage hole 4121 on bottom of the periphery wall 412 to drain water out from the sleeve 41.

Figure 7:
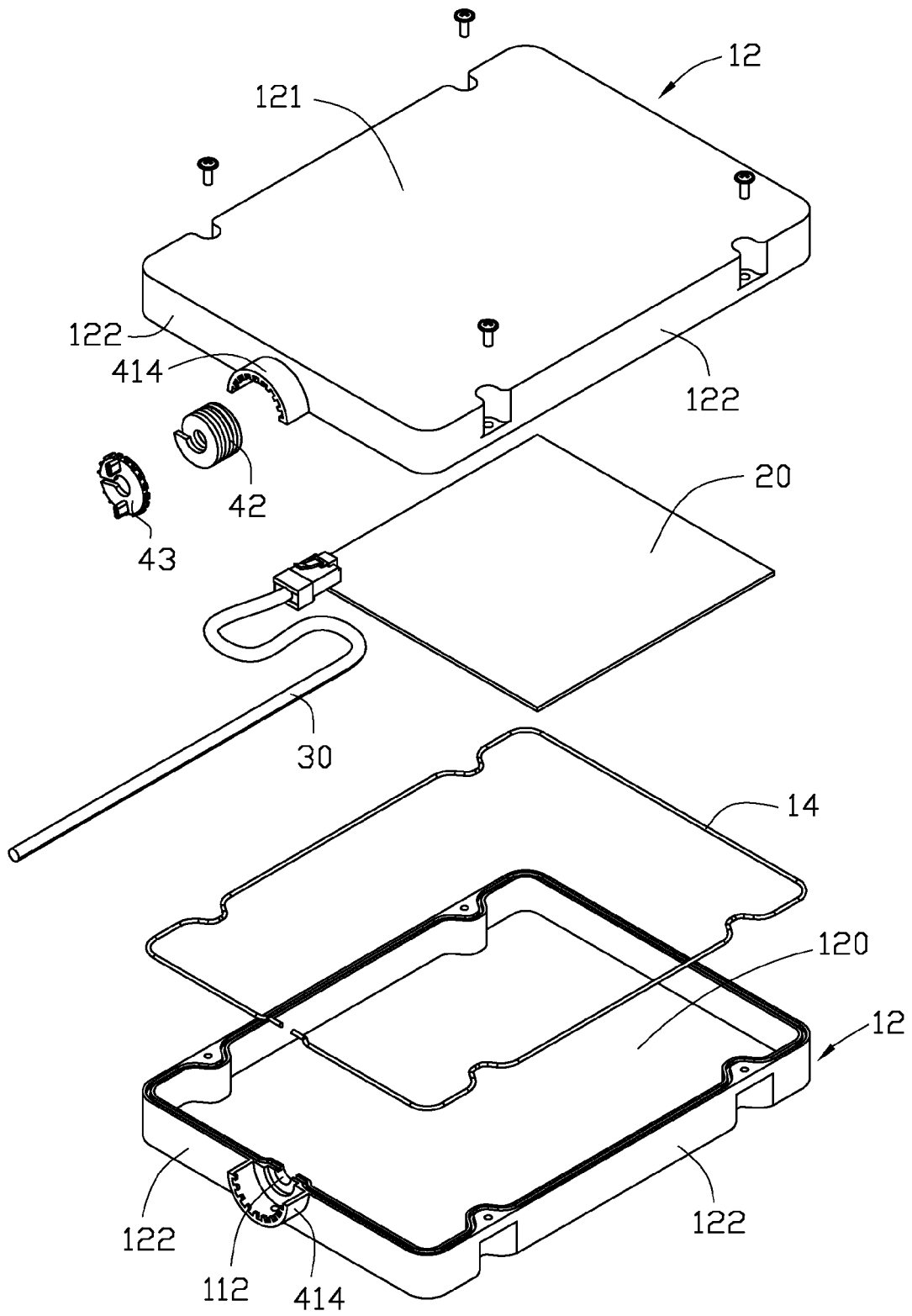
FIG. 7 is an exploded perspective view of the communication device in accordance with the present disclosure.

Referring to FIG. 7, in the illustrated embodiment, two ends of the transmission wire 30 connect with connectors, respectively, and the size of the connector is larger than the outside diameter of the first through hole 11. The enclosure 10 comprises a pair of lid portions 12 and a sealing ring 14 sealed between the pair of lid portions 12. The pair of lid portions 12 cooperatively defines a receiving room 120 sealed by the sealing ring 14. The circuit arrangement 20 is received in the receiving room 120 to connect with the transmission wire 30. Each of the pair of the lid portions 12 comprises a top wall 121 and a plurality of side walls 122 surrounding the top wall 121 perpendicularly. The sleeve 41 of the waterproof jacket assembly 40 comprises a pair of latching portions 414 protruding outwardly from one of the plurality of the side walls 122. Each of the plurality of the side walls 122 defines a recessing portion 112 on the edge of the corresponding side wall 122. The recessing portion 112 coaxially communicates with the first through hole 11 of the enclosure 10. When sealing the pair of lid portions 12, the pair of latching portions 414 latches with each other to cooperatively form the sleeve 41, and the pair of recessing portions 112 engages with each other to cooperatively form the first through hole 11. When assembling, the transmission wire 30 passes through the recessing portion 112 of the corresponding side wall 122 directly, and the pair of lid portions 12 engages with each other to make the transmission wire 30 pass through the first through hole 11. The transmission wire 30 passes through in the second through hole 432 of the cover board 43, the elastic waterproof element 42 winds up the transmission wire 30, and the cover board 43 engages with the sleeve 41 to assemble the waterproof jacket assembly 40.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A waterproof jacket assembly, applied in a communication device comprising an enclosure, the enclosure having a plurality of sidewalls, a first through hole extending from one of the sidewalls of the enclosure to an inner of the enclosure for at least one transmission wire passing through, the waterproof jacket assembly mounted on the outer surface corresponding to the first through hole and comprising:

a sleeve, defining a receiving cavity in communication with the first through hole;

an elastic waterproof element, received in the receiving cavity, and helically wrapped around the transmission wire; and a cover board, engaged with the sleeve, and the transmission wire passing through the cover board to drive the elastic waterproof element to fill in the receiving cavity;

wherein the elastic waterproof element is received in the receiving cavity with a first end of the elastic waterproof element fixed to the cover board, and a second end of the elastic waterproof element resisting on one of the sidewalls of the enclosure, wherein rotation of the cover board allows winding of the transmission wire along a radial direction of the elastic waterproof element, and wherein diameter of the transmission wire along the radial direction of the elastic waterproof element seals the first through hole and the transmission wire along both the axial direction and the radial direction of the elastic waterproof element by pushing the cover board towards the enclosure and pressing the elastic waterproof element along the axial direction of the elastic waterproof element.

2. The waterproof jacket assembly as claimed in claim 1, wherein the sleeve comprises a first positioning portion and the cover board comprises a second positioning portion extending radially from the main body outwardly, the second positioning portion interferes with the first positioning portion to position the cover board in the sleeve.

3. The waterproof jacket assembly as claimed in claim 2, wherein the first positioning portion comprises a plurality of blocks protruding radially from one edge of the sleeve toward the receiving cavity and defines a plurality of first grooves between any two adjacent blocks of the first positioning portion, the second positioning portion comprises a plurality of stopper portions and defines a plurality of second grooves between any two adjacent stopper portions, each of the plurality of blocks passes through the corresponding second groove and interferingly engages with the corresponding stopper portions.

4. The waterproof jacket assembly as claimed in claim 3, wherein each of the plurality of stopper portions comprises a first abutting portion and a second abutting portion perpendicular to the first abutting portion, the first abutting portion resists on the corresponding block and each of the plurality of the blocks latches on the corresponding second abutting portion.

5. The waterproof jacket assembly as claimed in claim 4, wherein the first abutting portion and the second abutting portion collectively form an "L" shape.

6. The waterproof jacket assembly as claimed in claim 1, wherein the sleeve is integrally formed with the enclosure.

7. The waterproof jacket assembly as claimed in claim 1, wherein the sleeve comprises a periphery wall, and the periphery wall defines a drainage hole on bottom of the periphery wall to drain water out from the sleeve.

8. The waterproof jacket assembly as claimed in claim 1, wherein the elastic waterproof element is made of rubber.

9. The waterproof jacket assembly as claimed in claim 1, wherein the cover board defines a second through hole and a latching groove, the latching groove extends from edge of the cover board to the second through hole and communicates with the second through hole, the transmission wire passes through the second through hole along the latching groove.

10. The waterproof jacket assembly as claimed in claim 1, wherein the cover board further comprises a pair of operating portions protruding outwardly from the cover board and used for user rotating the cover board conveniently.

11. A communication device, comprising:
an enclosure, the enclosure having a plurality of sidewalls, a first through hole extending from one of the sidewalls of the enclosure to an inner of the enclosure;
a circuit arrangement, received in the enclosure;
at least one transmission wire, passing through the first through hole to connect the circuit arrangement with another communication device for communicating; and
a waterproof jacket assembly, mounted on the outer surface corresponding to the first through hole and comprising:
a sleeve, defining a receiving cavity in communication with the first through hole;
an elastic waterproof element, received in the receiving cavity, and helically wrapped around the transmission wire; and
a cover board, engaged with the sleeve, and the transmission wire passing through the cover board to drive the elastic waterproof element to fill in the receiving cavity;
wherein the elastic waterproof element is received in the receiving cavity with a first end of the elastic waterproof element fixed with the cover board, and a second end of the elastic waterproof element resisting on one of the sidewalls of the enclosure, wherein rotation of the cover board allows winding of the transmission wire along a radial direction of the elastic waterproof element and wherein diameter of the transmission wire along the radial direction of elastic waterproof element seals the first through hole and the transmission wire along both the axial direction and the radial direction of the elastic waterproof element by pushing the cover board towards the enclosure and pressing the elastic waterproof element along the axial direction of the elastic waterproof element.

12. The communication device as claimed in claim 11, wherein the sleeve comprises a first positioning portion and the cover board comprises a second positioning portion extending radially from the main body outwardly, the second positioning portion interferes with the first positioning portion to position the cover board on the sleeve and to shield the receiving cavity.

13. The communication device as claimed in claim 12, wherein the first positioning portion comprises a plurality of blocks protruding radially from one edge of the sleeve toward the receiving cavity and defines a plurality of first grooves between any two adjacent blocks of the first positioning portion, the second positioning portion comprises a plurality of stopper portions and defines a plurality of second grooves between any two adjacent stopper portions, each of the plurality of blocks passes through the corresponding second groove and interferingly engages with the corresponding stopper portions.

14. The communication device as claimed in claim 13, wherein each of the plurality of stopper portions comprises a first abutting portion and a second abutting portion perpendicular to the first abutting portion, the first abutting portion resists on the corresponding block and each of the plurality of the blocks latches on the corresponding second abutting portion.

15. The communication device as claimed in claim 14, wherein the first abutting portion and the second abutting portion collectively form an "L" shape.

16. The communication device as claimed in claim 11, wherein the sleeve is integrally formed with the enclosure.

17. The communication device as claimed in claim 11, wherein the sleeve comprises a periphery wall, and the periphery wall defines a drainage hole on bottom of the periphery wall to drain water out from the sleeve.

18. The communication device as claimed in claim 11, wherein the elastic waterproof element is made of rubber.

19. The communication device as claimed in claim 11, wherein the cover board defines a second through hole and a latching groove, the latching groove extends from edge of the cover board to the second through hole and communicates with the second through hole, the transmission wire passes through the second through hole along the latching groove.

20. The communication device as claimed in claim 11, wherein the cover board further comprises a pair of operating portions protruding outwardly from the cover board and used for user rotating the cover board.

* * * * *